United States Patent
Park et al.

(10) Patent No.: US 7,949,927 B2
(45) Date of Patent: May 24, 2011

(54) ERROR CORRECTION METHOD AND APPARATUS FOR PREDETERMINED ERROR PATTERNS

(75) Inventors: Jihoon Park, Minneapolis, MN (US);
Jaekyun Moon, Minneapolis, MN (US);
Jun Lee, Seongnam-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 1226 days.

(21) Appl. No.: 11/598,771

(22) Filed: Nov. 14, 2006

(65) Prior Publication Data
US 2008/0115041 A1    May 15, 2008

(51) Int. Cl.
*H03M 13/17* (2006.01)
*H03M 13/45* (2006.01)

(52) U.S. Cl. ......... 714/762; 714/780; 714/781; 714/795
(58) Field of Classification Search .................. 714/762, 714/780, 781, 795
See application file for complete search history.

(56) References Cited

U.S. PATENT DOCUMENTS

| | | | | |
|---|---|---|---|---|
| 5,712,861 | A | * | 1/1998 | Inoue et al. ..................... 714/752 |
| 6,009,552 | A | * | 12/1999 | Ariel et al. ..................... 714/780 |
| 6,415,112 | B1 | | 7/2002 | Kimizuka et al. |
| 6,691,278 | B1 | * | 2/2004 | Patapoutian et al. ......... 714/801 |
| 6,823,487 | B1 | * | 11/2004 | Poeppelman ................. 714/785 |
| 7,089,483 | B2 | * | 8/2006 | McEwen et al. .............. 714/795 |
| 7,260,766 | B2 | * | 8/2007 | Levy et al. ..................... 714/780 |
| 7,328,395 | B1 | * | 2/2008 | Burd ............................... 714/780 |
| 7,571,372 | B1 | * | 8/2009 | Burd et al. ..................... 714/769 |
| 7,644,338 | B2 | * | 1/2010 | Park et al. ..................... 714/758 |
| 2002/0133778 | A1 | * | 9/2002 | Bessios .......................... 714/752 |
| 2003/0066021 | A1 | * | 4/2003 | Reggiani et al. .............. 714/795 |
| 2003/0140303 | A1 | | 7/2003 | Litwin, Jr. et al. |

FOREIGN PATENT DOCUMENTS

KR    1020040073642    8/2004

OTHER PUBLICATIONS

C. M. Hackett, "An Efficient Algorithm for Soft-Decision Decoding of the (24,12) Extended Golay Code", IEEE Transactions on Communications, vol. COM-29, No. 6, Jun. 1981, pp. 909-911.*
Jihoon Park et al., "High-Rate Error-Correction Codes Targeting Dominant Error Patterns", IEEE Transactions on Magnetics IEEE USA, vol. 42, No. 10, Oct. 2006, pp. 2573-2575.
Jihoon Park et al., "GEN03-4: Cyclic Codes Tailored to a known Set of Error Patterns", Global Telecommunications Conference, 2006. Globecom '60. IEEE, IEEE, PI, Nov. 27, 2006, pp. 1-5.

(Continued)

*Primary Examiner* — Stephen M Baker
(74) *Attorney, Agent, or Firm* — Volentine & Whitt, PLLC

(57) ABSTRACT

In a method of detecting an error pattern in a codeword transmitted across a noisy communication channel, a codeword is detected. A syndrome is then generated by applying a generator polynomial to the codeword. The generator polynomial is adapted to produce a distinct syndrome set for each of "L" (L>1) different error patterns potentially introduced in the codeword during transmission across the communication channel. A type of an error pattern within the codeword is detected based on the syndrome or a shifted version of the syndrome, and then a start position of the error pattern within the codeword.

8 Claims, 3 Drawing Sheets

OTHER PUBLICATIONS

Jaekyun Moon et al., "Cyclic Redundancy Check Code Based on High-Rate Error-Detection Code for Perpendicular Recoding", IEEE Transactions on Magnetics, IEEE Service Center, New York, NY, US, vol. 42, May 1, 2006, pp. 1626-1628.

Sawaguchi, H. et al., "Soft-Output Post-Processing Detection for PRML Channels in the Presence of Data-Dependent Media Noise", Proc. 2003 IEEE Global Telecommunications Conference, vol. 7, Dec. 1, 2003, pp. 3913-3920.

Jaekyun Moon et al., "Pattern-Dependent Noise Prediction in Signal Dependent Noise", IEEE Journal on Selected Areas in Communications, IEEE Service Center, Piscataway, US, vol. 19, No. 4, Apr. 1, 2001.

\* cited by examiner

ERROR CORRECTION METHOD AND APPARATUS FOR PREDETERMINED ERROR PATTERNS

BACKGROUND OF THE INVENTION

1. Field of the Invention

Embodiments of the invention relate generally to an error correction method. More particularly, embodiments of the invention relate to an error correction method capable of correcting single occurrences of predetermined error patterns.

2. Description of Related Art

Error detection and correction techniques play an important role in a variety of communication systems where data is transmitted across noisy communication channels. As the data is transmitted across the noisy channels, it may become corrupted. However, the error detection and correction techniques allow the data to be restored to its original uncorrupted state.

Most error detection and correction techniques involve transmitting some form of redundant data across a communication channel together with a data payload. For example, redundant data such as a parity bit or a checksum may be combined with data to be transmitted, and then subsequently used to detect and correct errors in the data.

One common technique used for error detection and correction is cyclic redundancy check (CRC). In this technique, data to be transmitted is modified by a generator polynomial to form a codeword. Here, the term codeword should be interpreted broadly to refer to data that has been modified to form a code. The length of a codeword can vary, and a codeword may include multiple cycles of a cyclic code. The term "transmitted codeword" will be used to refer to a codeword before it is decoded by a receiving device, and the term "detected codeword" will be used to refer to a codeword after it has decoded by a receiving device. Since errors can be introduced into the transmitted codeword during transmission, the transmitted codeword before transmission may be different from the detected codeword.

A given communication channel often tends to produce errors in specific patterns. Such patterns can often be discovered, for example, through observation, or from a priori knowledge of the channel's characteristics. Because the errors tend to occur in specific patterns, error correction techniques can take advantage of the known error patterns for a particular channel to determine how to best detect and correct the error patterns.

One example of how known error patterns can be used in error correction is to compute an estimated error signal for a detected codeword and then correlate the estimated error with the known error patterns. When this technique is successful, it produces an error pattern and a start position of the error pattern within the detected codeword.

The estimated error signal used in the above technique is typically computed as a difference between an equalized sequence and a convolution of the detected codeword and an equalizer target response. The detected codeword is typically generated by performing a Viterbi-decoding operation on the equalized sequence, and the equalizer target response is a partial response of an equalizer used to produce the equalized sequence.

Unfortunately, the above technique has a tendency to miscorrect errors, either by predicting a wrong type of error pattern among the known error patterns, or by predicting a wrong position of an error pattern within the detected codeword. Due to these mis-corrections, the above error-correction technique can have a negative impact on the performance of a communication system.

SUMMARY OF THE INVENTION

According to one embodiment of the invention, a method of detecting an error pattern in a codeword transmitted across a noisy communication channel comprises detecting the codeword, and generating a syndrome by applying a generator polynomial to the codeword. The generator polynomial is adapted to produce a distinct syndrome set for each of "L" (L>1) different error patterns potentially introduced in the codeword during transmission across the communication channel. The method further comprises determining a type of an error pattern in the codeword based on the syndrome or a shifted version of the syndrome, and determining a start position of the error pattern within the codeword.

According to another embodiment of the invention, an error correction apparatus comprises a Viterbi decoder adapted to receive a transmitted codeword and produce a detected codeword, and a syndrome computation unit adapted to receive the detected codeword and produce a syndrome by applying a generator polynomial to the detected codeword. The generator polynomial is adapted to produce a distinct syndrome set for each of "L" (L>1) different error patterns potentially introduced in the codeword during transmission across the communication channel. The apparatus further comprises an error type decision and list of possible positions (ETDLPP) unit adapted to determine a type of an error pattern in the detected codeword based on the syndrome produced by the syndrome computation unit, and further adapted to determine potential start positions of the error pattern within the detected codeword. The apparatus still further comprises a soft metric computation unit adapted to receive the transmitted codeword, the detected codeword, and the potential start positions produced by the ETDLLP unit and compute a start position of the error pattern within the detected codeword, and an error correction unit adapted to correct the error pattern in the detected codeword based on the type and start position of the error pattern.

According to yet another embodiment of the invention, a method of encoding data for transmission across a noisy communication channel comprises applying a generator polynomial to the data to produce a codeword. The generator polynomial is adapted to produce a distinct syndrome set for each of "L" (L>1) different error patterns potentially introduced in the codeword during transmission across the communication channel.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Figure 1:
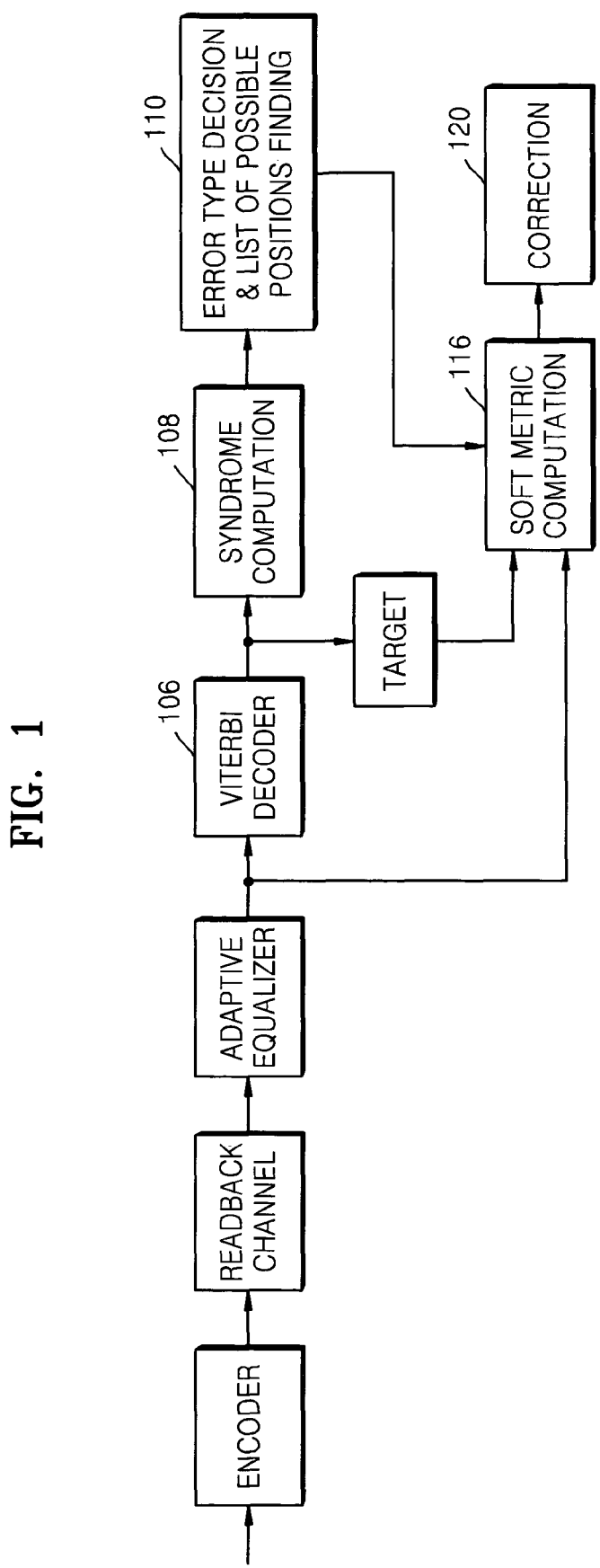
FIG. 1 is a block diagram illustrating a technique for correcting error-patterns according to an embodiment of the present invention.

Exemplary embodiments of the invention are described below with reference to the corresponding drawings. These embodiments are presented as teaching examples. The actual scope of the invention is defined by the claims that follow.

Conventional block error correction codes (ECCs), such as BCH codes, are designed to have a minimum distance property that guarantees correction of up to "t" errors within a received data word. However, in interference-dominant channels, such as a readback channel in a high-density magnetic recording apparatus, errors tend to occur in specific patterns.

Although conventional error correction codes can correct some of these frequently observed error patterns, they are not very effective in correcting against all types of error patterns. For example, conventional techniques often fail to correct error patterns with a large number of non-zero bits, i.e., error patterns with high weights.

Embodiments of the invention provide a new approach to designing error correction codes. For example, selected embodiments of the invention relating to cyclic codes allow the correction of the occurrence of any one of "L" known error patterns rather than "t" bit errors.

In one embodiment of the invention, a list of "L" error patterns known to make up a large percentage of all observed errors related to a particular communication channel are detected by designing a generator polynomial adapted to produce a distinct syndrome set for each of the "L" error patterns. In general, the list of most common error patterns for a channel can be obtained from empirical data, computer simulation, or effective distance analysis of the channel, for example.

The term "syndrome set" here refers to a collection of syndromes, and the term "syndrome" denotes a remainder of a detected codeword or a message block when divided by a generator polynomial. The process of determining a syndrome from a codeword will be referred to as "capturing" the syndrome.

One property of the list of "L" error patterns is that no two error patterns within the list map to the same syndrome set, and a single occurrence of any one of the error patterns can be successfully detected. Within each syndrome set, each syndrome uniquely corresponds to a single error pattern among the list of known error patterns. In addition, each syndrome also corresponds to either a precise position of the single error pattern within the detected codeword, or to a few possible positions. By tailoring the generator polynomial specifically to the known set of error polynomials, the code becomes highly effective in handling the frequently observed error patterns.

The rate of the above-described code can be extended by applying the same generator polynomial to a considerably larger message block. The larger message block is a block code that contains a finite number of information (message) bits and corresponding check bits. A large message block can be encoded to achieve a high code rate under a certain constraint for the message block length. For example, to make the extended code cyclic, the overall code length is constrained to be an integer multiple of a base code length.

The base code can be thought of as a cyclic block code for a message block, e.g., 6 message bits, multiplied by a generator polynomial. The extended code is an extended version for a larger message block, e.g., 294 (=6×49) message bits, multiplied by the same generator polynomial. Although the extended code and the base code typically have the same number of check bits, the extended code has a much higher code rate, e.g., 0.5 (=6/12) for a (12,6) base code and 0.98 (=294/300) for a (300,294) extended code.

A captured syndrome uniquely identifies an error pattern from the list of known error patterns. However, it usually corresponds to more than one possible error pattern position.

A final decision regarding the position of an error pattern can be made by computing the maximum likelihood position based on the error pattern and a number of possible positions. A biased form of soft metric can be used to reduce the probability of mis-correction, i.e., correction of the wrong error pattern or correction of an error pattern at a wrong position.

The design of a base code for encoding transmitted data is described in further detail below.

The base code is designed by applying a generator polynomial for a cyclic code to a set of information (message) bits. The generator polynomial is designed to produce distinct syndrome sets for a given list of known error patterns.

Let $e_i(x)$, i=1 . . . , L, represent a set of dominant error patterns in the form of polynomials with binary coefficients. In a cyclic code, a set (cycle) of syndromes corresponds to all possible cyclic shifts of a given error polynomial. To detect and correct a single occurrence of any error pattern from a list of dominant patterns, the syndrome sets corresponding to the targeted error patterns must all be different (which implies that the sets are also non-overlapping). Thus, the generator polynomial may be beneficially designed in such a way that the syndrome sets for the known dominant error patterns are all distinct.

Given a (p, p-r) cyclic code with a generator polynomial of degree "r", the total number of distinct syndromes is $2^r$, and there are $2^p$ possible error events (including the all-zero error event). Accordingly, where p>r, as in most efficient codes, there are more possible error events than distinct syndromes. As a result, it would be impossible to generate distinct syndrome sets for all possible error events. Therefore, the generator polynomial is designed to generate distinct syndrome sets for the known set of dominant error patterns, rather than for low-weight error events, as is done in traditional ECC design.

One starting point for designing a base code according to selected embodiments of the invention is to establish conditions that will allow targeted error polynomials to correspond to distinct sets of syndromes. One such condition is as follows. Let $c_i(x)$ be a greatest common divisor (GCD) between a generator polynomial $g(x)$ and an error polynomial $e_i(x)$. It can be shown that if each $c_i(x)$ is different, then the respective syndrome sets corresponding to error polynomials $e_i(x)$ are all different.

Let $p_j(x)$, j=1, 2, . . . , K, be irreducible factors making up all error polynomials $e_i(x)$, and let $d_j$ be a maximum power in which $p_j(x)$ appears in any one error polynomial $e_i(x)$, i=1, 2, . . . , L. In this case, a generator polynomial of the form $$g(x)=p_1^{d_1}(x)p_2^{d_2}(x)p_3^{d_3}(x)\ldots p_K^{d_K}(x) \quad (1)$$

gives rise to distinct GCDs for all error polynomials $e_i(x)$.

There may exist a lower degree generator polynomial $g(x)$ that can yield distinct syndrome sets for all targeted error polynomials. Such a generator polynomial can be searched by starting from a general form (e.g., a least common multiple (LCM) of all error polynomials $e_i(x)$) given by equation (1) but with each power $d_j$ increased from zero. The search then finds a lowest degree generator polynomial $g(x)$ in the form of equation (1) that gives either distinct $c_i(x)$ or else does not divide $e_i(x)+x^\rho e_j(x)$, for any non-negative integer $\rho$, for which $c_i(x)=c_j(x)$. This last condition ensures that the syndromes of $e_i(x)$ and $x^\rho e_j(x)$, are different.

As an example of a base code design for perpendicular recording, a hyperbolic tangent transition response is assumed, with equalizer target response of $5+6D-D^3$ at user density 1.4. The user density is defined as 'pw50/T', where pw50 is a width over −50% to 50% of the transition response saturation level, and T is a user bit period. The parameter "D"

here is a delay variable in a digital sequence. The noise mixture is assumed to be 10% additive white Gaussian noise (AWGN) and 90% jitter noise.

For a decoder, a Viterbi decoder with a branch metric modified to incorporate a pattern-dependent noise predictor (PDNP), with 4 prediction taps for each branch, is used. The predictor taps operate on previous bits implied in a survivor path. A Viterbi decoder based on a conventional Euclidean metric is also considered for comparison.

TABLE I

Dominant error patterns for Viterbi/PDNP decoders

| Viterbi | Viterbi + PDNP | Irreducible factors |
|---|---|---|
| ±[2] | | 1 |
| ±[2, −2] | ±[2, −2] | (1 + x) |
| ±[2, −2, 2] | ±[2, −2, 2] | (1 + x + $x^2$) |
| ±[2, −2, 2, −2] | ±[2, −2, 2, −2] | $(1 + x)^3$ |
| ±[2, −2, 2, −2, 2] | ±[2, −2, 2, −2, 2] | $(1 + x + x^2 + x^3 + x^4)$ |
| ±[2, −2, 2, −2, 2, −2] | ±[2, −2, 2, −2, 2, −2] | $(1 + x)(1 + x + x^2)^2$ |
| ±[2, −2, 2, −2, 2, −2, 2] | | $(1 + x + x^3)(1 + x^2 + x^3)$ |

Table I lists dominant error patterns that make up 98.78% and 98.13% of the observed error patterns at BER=$5 \times 10^{-5}$ for the conventional Viterbi decoder and the Viterbi+PDNP decoder, respectively. While the error patterns ±[2] and ±[2, −2, 2, −2, 2, −2, 2] are among the dominant patterns with the conventional Viterbi decoder, they occur much less frequently at the output of the Viterbi+PDNP decoder. As the equalizer target response changes, the error pattern characteristics also change. The base code construction methodology according to embodiments of the present invention, however, remains the same.

As discussed earlier, if the GCDs between all dominant error polynomials and generator polynomial g(x) are different, then corresponding syndrome sets are also different. For the set of dominant error patterns for the Viterbi+PDNP decoder, there are three irreducible polynomial factors: $(1+x)$, $(1+x+x^2)$ and $(1+x+x^2+x^3+x^4)$. A good choice for generator polynomial g(x) that can yield different GCDs for the dominant error patterns is generator polynomial $g(x)=(1+x)^4(1+x+x^2)^1 (1+x+x^2+x^3+x^4)^0 = 1+x+x^2+x^4+x^5+x^6$. With generator polynomial g(x), the GCDs for the 5 dominant error patterns are $(1+x)$, $(1+x+x^2)$, $(1+x)^3$, 1, and $(1+x)(1+x+x^2)$, respectively. It turns out that as a bonus, this particular generator polynomial g(x) can also produce different syndrome sets for 5 extra error patterns outside the target set. This generator polynomial g(x) has period 12 and gives rise to a (12, 6) cyclic code.

Table II below shows syndrome sets in decimal numbers for 5 dominant error patterns as well as 5 non-dominant (but not completely negligible) error patterns in polynomial form. The respective syndromes corresponding to the dominant error patterns in the list eventually repeat themselves as feedback shift register content reflecting the syndrome of each captured error pattern keeps shifting. Accordingly, only one syndrome in each syndrome set needs to be stored to recognize an error pattern. This assumes that a relatively small latency can be tolerated, for example, a maximum of 12 clock periods here, corresponding to the size of the largest syndrome set.

Note that the generator polynomial $g(x)=(1+x)^3(1+x+x^2)$ also meets the design criterion that each known error pattern corresponds to a single syndrome set. However, generator polynomial $g(x)=(1+x)^3(1+x+x^2)$ may be less effective than some other generator polynomials in terms of overall error pattern correction capability.

TABLE II

Syndrome set computed by generator polynomial g(x) = 1 + x + $x^2 + x^4 + x^5 + x^6$

| Targeted error patterns | Syndrome set in decimal number |
|---|---|
| ±[2, −2]/±[2, −2, 2, −2, 2, −2, 2, −2, 2, 2] | [48, 24, 12, 6, 3, 58, 29, 53, 33, 43, 46, 23] |
| ±[2, −2, 2] | [56, 28, 14, 7] |
| ±[2, −2, 2, −2] | [60, 30, 15] |
| ±[2, −2, 2, −2, 2]/±[2, −2, 2, −2, 2, −2, 2, −2, 2, 2, −2] | [62, 31, 52, 26, 13, 61, 37, 41, 47, 44, 22, 11] |
| ±[2, −2, 2, −2, 2, −2] | [63, 36, 18, 9] |
| ±[2, −2, 0, 2, −2] | [54, 27] |
| ±[2, −2, 2, −2, 2, −2, 2]/±[2] | [4, 2, 1, 59, 38, 19, 50, 25, 55, 32, 16, 8] |
| ±[2, −2, 2, −2, 2, −2, 2, −2] | [34, 17, 51] |
| ±[2, −2, 2, −2, 2, −2, 2, −2, 2, −2] | [49, 35, 42, 21] |
| ±[2, −2, 2, −2, 2, −2, 2, −2, 2, −2, 2, −2] | [45] |

A method of extending the base code will now be described below.

Once a degree-r generator polynomial g(x) of period "p" is designed, and a (p, p-r) base cyclic code is provided, the base code can be extended with any positive integer "s" into a (ps, ps-r) cyclic code. For example, with a generator polynomial $g(x)=1+x+x^2+x^4+x^5+x^6$ having a period 12, a (300, 294) extended cyclic code having a code rate of 0.98 can be formed.

In the extended cyclic code, each syndrome, while still corresponding to a particular error pattern in the list of known error patterns, also corresponds to a number of possible positions for that error pattern within the extended cyclic code. Because of the cyclic property of the code, the syndrome cycles now repeat over the entire length of the code.

For example, for the (300, 294) cyclic code, if the captured syndrome is 48 (in decimal notation), then the error pattern is identified as ±[2, −2], from Table II. However, since the syndrome repeats every 12 bits, possible starting positions for this error pattern are {1, 13, 25, . . . , 289}. While certain positions can be ruled out by a bit polarity check based on the already determined error pattern, the most likely position of the error pattern can be found using a soft metric, with a modification to incorporate PDNP.

Using the soft metric is similar to running a correlator-based post-Viterbi correction processor. One difference, however, is that here only one correlator matched to the identified error pattern is turned on for each received block. In addition, only known possible positions are scanned to find a likely error start position. Moreover, introducing a bias term in the soft metric can generate additional information which can provide additional error correction capability and reduce the probability of mis-correction, as discussed below.

For purposes of computing the soft metric, let $e_i(x)=(1+e_1x+ \ldots +x^{l_i-1})$ and $p_m$, m=1, . . . j, . . . M, represent identified error patterns and M possible error pattern positions, respectively. The soft metric can therefore be defined by the following equation (2):

$$\sum_{k=p_m}^{p_m^{(i)}+l_i+l_n-2} [(r_k - \hat{s}'_k)^2 - (r_k - \hat{s}_k)^2 + 2(r_k - \hat{s}'_k) \cdot e^h_{i,k}]. \quad (2)$$

In equation (2), $r_k$ represents an input sequence for a Viterbi decoder, and $\hat{s}_k$ represents a convolution of a length $l_h$ target response $h_k$ and an output sequence of the Viterbi decoder. The term $\hat{s}'_k$ represents a convolution of the target response $h_k$ and the corrected Viterbi output sequence according to the known error pattern $e_i(x)$, and $e_{i,k}^h$ represents a convolution of $e_i(x)$ and $h_k$.

Based on the foregoing, it can be shown that at each of the M positions, the above biased soft metric can be computed according to the following equation (3):

$$\sum_{k=p_m}^{p_m+l_i+l_n-2} [(r_k - \hat{s}'_k)^2 - (r_k - \hat{s}_k)^2 + 2(r_k - \hat{s}'_k) \cdot e_{i,k}^h] = \qquad (3)$$

$$\sum_{k=p_m}^{p_m+l_i+l_n-2} [(n'_k)^2 - (e_{i,k}^h + n_k)^2 + 2n_k \cdot e_{i,k}^h] - \sum_{k=p_m}^{p_m+l_i+l_n-2} [e_{i,k}^h]^2$$

In equation (3), the terms $n'_k$ and $n_k$ represent predicted noise sequences, based on the previous bits in survivor paths corresponding to the terms $\hat{s}'_k$ and $\hat{s}_k$ respectively.

The noise-dependent terms are eliminated by the added term $2(r_k - \hat{s}'_k) \cdot e_i^h{}_{,k}$ in equation (3). Note that the soft metric gives a noise-free value of energy of a known output error sequence only when the position of a predicted error pattern matches an actual position of an error pattern (in the modulo fashion).

As illustrated by Table II, an error pattern outside a known set of error patterns may map to the same syndrome as a known error pattern. These error patterns outside the set of known error patterns do not occur frequently, but they do occur with non-zero probabilities. However, based on the biased metric, these error patterns outside the set of known error patterns can be distinguished from dominant error patterns and corrected since their output energy is different in each case.

Exemplary implementations of error correction techniques according to selected embodiments of the invention are described below. The performance of these implementations is evaluated by their overall bit error rate.

Simulations were performed for two different error correction techniques according to different embodiments of the present invention. In a first technique, denoted 'proposed ECC I', putative positions of known error patterns are identified using the conditional maximum likelihood (ML) metric, with PDNP incorporated. In a second technique, denoted 'proposed ECC II', the same procedure is performed as in the first technique, except that the second technique further incorporates the computation of the biased soft metric of equation (3). The biased metric of equation (3) enables correction of a few additional error patterns as well as reduction of a miscorrection probability. A block diagram illustrating the first and second error correction techniques is shown in FIG. 1.

Referring to FIG. 1, stored data is encoded by an encoder to form a codeword to be transmitted through a readback channel. The codeword is transmitted through the readback channel and then reshaped by an adaptive equalizer. After the codeword is reshaped by the adaptive equalizer, it is input to a Viterbi decoder 106 and a soft metric computation unit 116.

Viterbi decoder 106 performs a Viterbi decoding operation on the codeword to produce a detected codeword. Syndrome computation unit 108 then computes a syndrome based on the detected codeword. Syndrome computation unit 108 outputs the computed syndrome to an error type decision and list of possible positions (ETDLPP) unit 110. ETDLPP unit 110 computes a predicted error pattern type in the detected codeword based on the computed syndrome or a shifted version of the syndrome. In addition, ETDLPP unit 110 also computes potential starting positions of an error pattern within the detected codeword based on a syndrome set corresponding to the syndrome, and a pattern polarity check of the predicted error pattern type.

Soft metric computation unit 116 computes a biased soft metric over the potential error starting positions to discriminate between error patterns outside a set of predetermined error patterns and error patterns inside the set of predetermined error patterns. As a result, soft metric computation unit 116 outputs an actual error starting position based on a conditional maximum likelihood metric. A correction unit 120 corrects an error within the detected codeword based on the predicted error pattern type and the actual error starting position.

Figure 2:
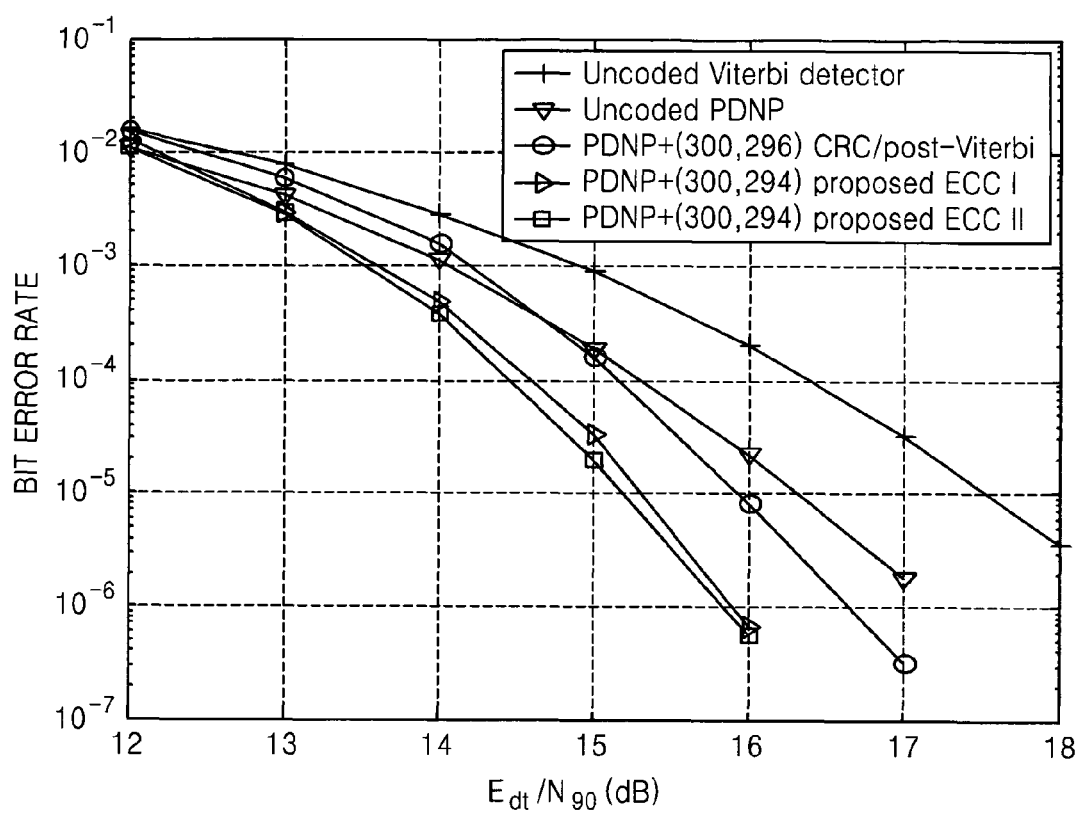
FIG. 2 is a graph illustrating Bit Error Rates (BERs) of various error correction techniques for comparison purposes; and, FIG. 3 is a graph illustrating Sector Error Rates (SERs) of various error correction techniques for comparison purposes.

FIG. 2 shows a graph illustrating Bit Error Rates (BERs) of various error correction techniques. The data illustrated in FIG. 2 is based on a readback channel having a target response of $5+6D-D^3$ for 10% AWGN and 90% jitter noise.

For comparison purposes, the BERs of an uncoded Viterbi decoder, uncoded PDNP, and a post-Viterbi processor in conjunction with error detection coding are also shown, where a (300, 296) cyclic redundancy check (CRC) code generated by a generator polynomial $g(x)=1+x^3+x^4$ is used to encode the data. The signal-to-noise ratio (SNR) has been defined as a ratio of the energy of the first derivative of the transition response $E_{dt}$ to the noise spectral density N90, which signifies 90% jitter noise.

Techniques provided by various embodiments of the invention outperform the post-Viterbi processor. For example, at a BER of $10^{-5}$ in FIG. 2, 'ECC I' shows SNR gains of 0.67 dB and 'ECC II' shows SNR gains of 0.81 dB relative to other techniques.

Figure 3:
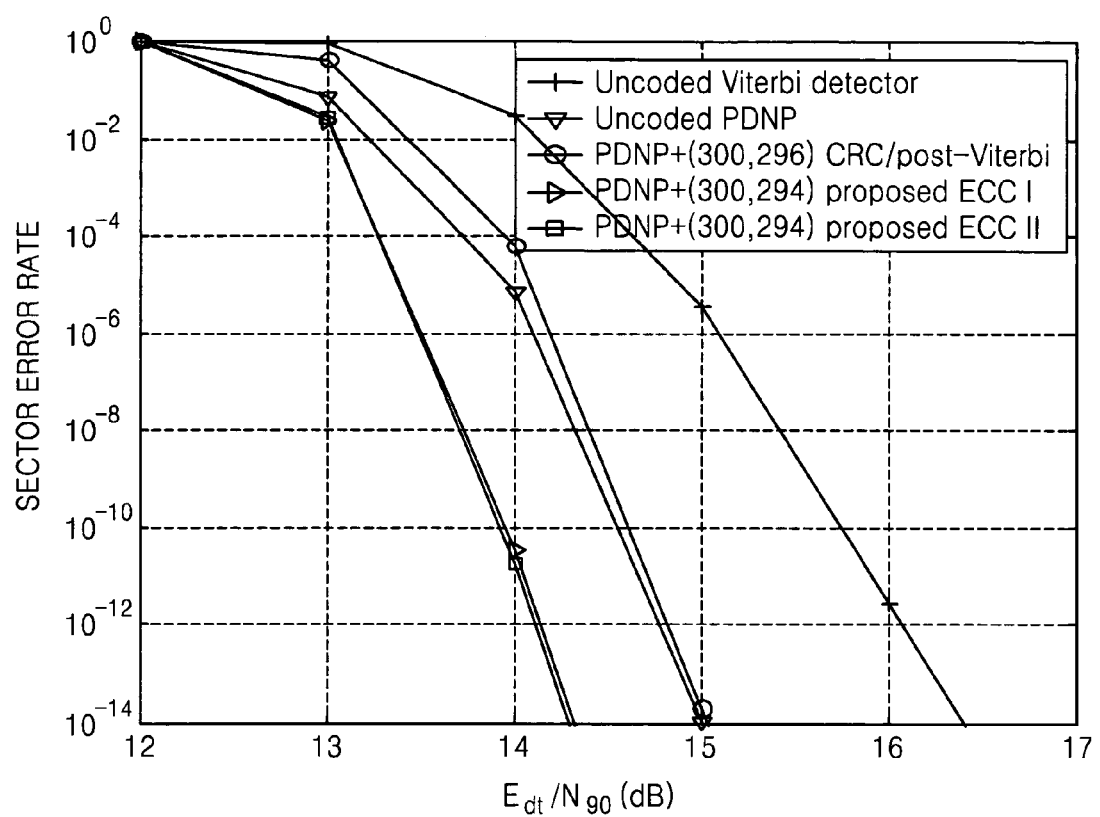

The sector error rate performance of various error correction techniques according to selected embodiments of the invention is described below with reference to FIG. 3. In particular, FIG. 3 shows sector error rate for these techniques in a system with a readback channel having a target response of $5+6D-D^3$ for 10% AWGN and 90% jitter noise.

An (n, k, t) Reed-Solomon (RS) code can correct up to "t" symbol errors in an "n" symbol code block that includes "k" information symbols. The sector error rate of an error correction process using an outer RS code will be described below. One popular way of computing the sector error rate of an error correction process using an outer RS code is based on a multinomial distribution for the probabilities of symbol errors associated with lengths.

For example, for each length "i" symbol error, where i= 1, . . . , k, we let $x_i$ and $p_i$ be a number and a probability of an error, respectively. The probability density function based on the multinomial distribution is then described by the following equation (4):

$$f_{x_1,\cdots,x_k}(x_1, \cdots, x_k) = \frac{n!}{n_1! x_2! \cdots x_{k+1}!} \cdot p_1^{x_1} p_2^{x_2} \cdots p_{k+1}^{x_{k+1}}. \qquad (4)$$

In equation (4), the terms $x_{k+1}$ and $p_{k+1}$ denote the number and probability of no erroneous symbols in a sector. Accordingly, $\Sigma_{i=1}^{k+1} p_i = 1$ and $\Sigma_{i=1}^{k+1} x_i = n$. The probabilities $p_i$ are estimated from the captured symbol error statistics.

To compute the SER for a 512-information-byte sector, a shortened RS code based on $GF(2^{10})$ is used. Since an (n, k, t) shortened RS code can correct up to "t" symbol errors in a sector and does not require an interleaving, the SER is simply given by the following equation (5):

$$P_{sector} = 1 - \Sigma_{x_1} \ldots \Sigma_{x_k} f_{x_1, \ldots, x_k}(x_1, \ldots, x_k) \qquad (5)$$

In equation (5), the sum is computed over all combinations of $x_1, \ldots, x_k$ such that $\Sigma_{i=1}^{k} i \cdot x_i \leq t$.

Assuming a (440, 410, 15) outer RS code, FIG. 3 compares the SERs of a technique according to selected embodiments of the invention with a (300, 296) CRC-based post-Viterbi processor. The technique according to selected embodiments of the invention shows a SNR gain of 0.71 dB at SER=$10^{-12}$ relative to other techniques.

As described above, an error pattern-control cyclic code is developed that targets a set of known dominant error patterns. A generator polynomial is tailored to a specific set of dominant error patterns to produce distinct sets of syndromes for the known dominant error patterns. The type and number of possible positions for error patterns that occur can be determined based on its syndrome. A soft metric is used to find a most-likely error position. A biased soft metric is also proposed that can improve the performance, by a small margin, by correcting additional error patterns as well as reducing mis-correction probability.

The foregoing preferred embodiments are teaching examples. Those of ordinary skill in the art will understand that various changes in form and details may be made to the exemplary embodiments without departing from the scope of the present invention as defined by the following claims.

What is claimed:

1. A method of detecting an error pattern in a codeword transmitted across a noisy communication channel, the method comprising:
    detecting the codeword;
    generating a syndrome by applying a generator polynomial to the codeword, wherein the generator polynomial is adapted to produce a distinct syndrome set for each of "L" (L>1) different error patterns having a relatively high occurrence and potentially introduced in the codeword during transmission across the communication channel;
    determining a type of an error pattern in the codeword based on the syndrome or a shifted version of the syndrome; and,
    determining a start position of the error pattern within the codeword by evaluating a period of the syndrome within the codeword and a bit polarity of the error pattern.

2. An error correction apparatus, comprising:
    a Viterbi decoder adapted to receive a transmitted codeword and produce a detected codeword;
    a syndrome computation unit adapted to receive the detected codeword and produce a syndrome by applying a generator polynomial to the detected codeword, wherein the generator polynomial is adapted to produce a distinct syndrome set for each of "L" (L>1) different error patterns potentially introduced in the codeword during transmission across the communication channel;
    an error type decision and list of possible positions (ETDLPP) unit adapted to determine a type of an error pattern in the detected codeword based on the syndrome produced by the syndrome computation unit, and further adapted to determine potential start positions of the error pattern within the detected codeword;
    a soft metric computation unit adapted to receive the transmitted codeword, the detected codeword, and the potential start positions produced by the ETDLLP unit and compute a start position of the error pattern within the detected codeword; and,
    an error correction unit adapted to correct the error pattern in the detected codeword based on the type and start position of the error pattern.

3. The apparatus of claim 2, wherein the transmitted codeword comprises an extended cyclic code.

4. The apparatus of claim 2, wherein the generator polynomial is computed by the equation $g(x)=p_1^{d_1}(x)p_2^{d_2}(x)p_3^{d_3}(x)\ldots p_K^{d_K}(x)$, wherein the terms $p_j(x): j \in \{1, 2, \ldots, K\}$ represent irreducible factors making up error polynomials $e_i(x): i \in \{1, 2, \ldots, L\}$ corresponding to the L error patterns, and the terms $d_j: j \in \{1, 2, \ldots, K\}$ represent maximum powers in which each respective $p_j(x)$ appears in any one of error polynomials $e_i(x)$.

5. The apparatus of claim 2, wherein the generator polynomial has the property that the greatest common divisors between the generator polynomial and a plurality of error polynomials corresponding to the "L" error patterns, respectively, are all distinct.

6. The apparatus of claim 2, wherein the soft metric computation unit computes the start position of the error pattern using the equation $$\sum_{k=p_m^{(i)}}^{p_m^{(i)}+l^{(i)}+l_h-2} [(r_k - \hat{s}'_k)^2 - (r_k - \hat{s}_k)^2 + 2(r_k - \hat{s}'_k) \cdot e_{i,k}^h],$$

wherein the terms $p_j(x): j \in \{1, 2, \ldots, K\}$ represent irreducible factors making up error polynomials $e_i(x): i \in \{1, 2, \ldots, L\}$ corresponding to the L error patterns, the terms $r_k$ represent inputs to a Viterbi decoding process, the terms $\hat{s}_k$ represent a convolution of a length $l_h$ target response $h_k$ of the communication channel with an output of the Viterbi decoding process, the terms $\hat{s}'_k$ represent a convolution of the target response with the output of the Viterbi decoding process, and the terms $e_{i,k}^h$ represent a convolution of error polynomials $e_i(x)$ with the target response.

7. The apparatus of claim 2, wherein the soft metric computation unit computes the start position of the error pattern using a conditional maximum likelihood metric defined by the equation $$\sum_{k=p_m^{(i)}}^{p_m^{(i)}+l^{(i)}+l_h-2} [(r_k - \hat{s}'_k - n'_k)^2 - (r_k - \hat{s}_k - n_k)^2],$$

wherein the terms $p_j(x): j \in \{1, 2, \ldots, K\}$ represent irreducible factors making up error polynomials $e_i(x): i \in \{1, 2, \ldots, L\}$ corresponding to the L error patterns, the terms $r_k$ represent inputs to a Viterbi decoding process, the terms $\hat{s}_k$ represent a convolution of a length $l_h$ target response $h_k$ of the communication channel with an output of the Viterbi decoding process, the terms $\hat{s}'_k$ represent a convolution of the target response with the output of the Viterbi decoding process, and the terms $n'_k$ and $n_k$ represent a predicted noise sequence, based on the previous bits in survivor paths of the Viterbi decoding process and corresponding to the terms $\hat{s}'_k$ and $\hat{s}_k$.

8. A method of encoding data for transmission across a noisy communication channel, the method comprising:
    applying a generator polynomial to the data to produce a codeword, wherein the generator polynomial is adapted to produce a distinct syndrome set for each of "L" (L>1) different error patterns potentially introduced in the codeword during transmission across the communication channel, wherein the generator polynomial is computed by the equation $g(x)=p_1^{d_1}(x)p_2^{d_2}(x)p_3^{d_3}(x)\ldots p_K^{d_K}(x)$, wherein the terms $p_j(x): j \in \{1, 2, \ldots, K\}$ represent irreducible factors making up $e_i(x): i \in \{1, 2, \ldots, L\}$ corresponding to the L error patterns, and the terms $d_j: j \in \{1, 2, \ldots, K\}$ represent maximum powers in which each respective $p_j(x)$ appears in any one of error polynomials $e_i(x)$.

* * * * *